(12) United States Patent  
Takahashi et al.

(10) Patent No.: US 8,710,525 B2  
(45) Date of Patent: Apr. 29, 2014

(54) LIGHT EMITTING DEVICE

(75) Inventors: Hiroki Takahashi, Tokushima (JP);  
Yoshitaka Bando, Anan (JP)

(73) Assignee: Nichia Corporation, Anan-shi (JP)

( * ) Notice: Subject to any disclaimer, the term of this patent is extended or adjusted under 35 U.S.C. 154(b) by 91 days.

(21) Appl. No.: 13/046,308

(22) Filed: Mar. 11, 2011

(65) Prior Publication Data  
US 2011/0222299 A1 Sep. 15, 2011

(30) Foreign Application Priority Data

Mar. 15, 2010 (JP) ................................. 2010-057162  
Mar. 11, 2011 (JP) ................................. 2011-053685

(51) Int. Cl.  
*H01L 33/00* (2010.01)

(52) U.S. Cl.  
USPC .............................................. 257/98; 257/99

(58) Field of Classification Search  
USPC ........ 257/99, 98, E33.013, E33.055; 362/363  
See application file for complete search history.

(56) References Cited

U.S. PATENT DOCUMENTS

| 6,274,890 | B1 | 8/2001 | Oshio et al. |
| 6,603,148 | B1 | 8/2003 | Sano et al. |
| 7,499,288 | B2 * | 3/2009 | Tanaka et al. ................. 361/767 |
| 7,771,093 | B2 | 8/2010 | Kishikawa et al. |
| 7,888,869 | B2 | 2/2011 | Tanda et al. |
| 7,910,946 | B2 | 3/2011 | Kamada |
| 2005/0224828 | A1 * | 10/2005 | Oon et al. ....................... 257/99 |
| 2006/0102917 | A1 | 5/2006 | Oyama et al. |
| 2007/0241362 | A1 | 10/2007 | Han et al. |
| 2007/0291489 | A1 | 12/2007 | Baroky et al. |
| 2008/0298063 | A1 | 12/2008 | Hayashi |
| 2009/0146176 | A1 | 6/2009 | Oishi |
| 2009/0242915 | A1 | 10/2009 | Chang Chien et al. |
| 2010/0027291 | A1 | 2/2010 | Hamada |
| 2010/0155771 | A1 | 6/2010 | Bando |
| 2010/0270571 | A1 * | 10/2010 | Seo ................................ 257/98 |
| 2012/0012879 | A1 | 1/2012 | Loh et al. |

FOREIGN PATENT DOCUMENTS

| JP | 05-050754 U | 7/1993 |
| JP | 10-261821 A | 9/1998 |
| JP | H11-346008 A | 12/1999 |
| JP | 2002-324917 A | 8/2002 |
| JP | 2002-252373 A | 9/2002 |
| JP | 2007-067284 A | 3/2007 |
| JP | 2007-157940 A | 6/2007 |
| JP | 2008-091864 A | 4/2008 |
| JP | 2008-300694 A | 11/2008 |
| JP | 2009-026846 A | 2/2009 |
| JP | 2009-146935 A | 7/2009 |
| WO | 2004-001862 A1 | 12/2003 |

* cited by examiner

*Primary Examiner* — Tran Tran  
(74) *Attorney, Agent, or Firm* — Global IP Counselors, LLP

(57) ABSTRACT

A light emitting device, has: a light emitting element; a metal member having an element mounting portion on which the light emitting element is mounted, and a flat portion disposed around the periphery of the element mounting portion; and a translucent sealing member that seals the light emitting element and a part of the metal member, the sealing member has a main body portion that seals the light emitting element and the metal member, a convex portion disposed on the main body portion, and a flange portion disposed around the periphery of the main body portion, the flange portion is disposed outside the range illuminated by light emitted from the light emitting element, and the flat portion of the metal member is bent toward the bottom face side of the light emitting device at least within the flange portion.

18 Claims, 7 Drawing Sheets

LIGHT EMITTING DEVICE

CROSS-REFERENCE TO RELATED APPLICATIONS

This application claims priority to Japanese Patent Applications No. 2010-57162 and 2011-53685 filed on Mar. 15, 2010 and Mar. 11, 2011. The entire disclosure of Japanese Patent Applications No. 2010-57162 and 2011-53685 is hereby incorporated herein by reference.

BACKGROUND OF THE INVENTION

1. Technical Field

The present invention relates to a light emitting device, and more particularly relates to a light emitting device constituted such that a light emitting element is installed on a metal member, and the light emitting element and a part of the metal member are embedded in a sealing member.

2. Related Art

In the past, the light emitting element shown in FIG. 7 has been proposed, for example, as a light emitting device in which a light emitting element is installed on a metal member, and the light emitting element and a part of the metal member are embedded in a sealing member (see JP-H11-346008-A).

With this light emitting device 40, a pair of lead terminals is constituted by a metal member 42 on which a light emitting element 41 is placed, and a metal member 43 that is paired with the metal member 42. The light emitting element 41 and the metal members 42 and 43 are embedded in a sealing member 44, and the sealing member 44 constitutes a lens-like convex portion 44a above the light emitting element 41.

With conventional light emitting devices such as this, a construction is usually employed in which the metal members are bent outside the sealing member, and when severe temperature changes in the usage environment of the light emitting device are taken into account, there is the risk that the metal members and the sealing member will not sufficiently adhere together. Also, with light emitting devices such as this, the metal members are surrounded by a relatively thick film of sealing member to ensure adequate strength of the sealing member. Accordingly, unintended light tends to leak from the side and bottom faces of the light emitting device, which lowers the light extraction efficiency to the top side of the light emitting device.

SUMMARY OF THE INVENTION

In view of this, it is an object of the present invention to provide a light emitting device with which light can be extracted more efficiently, and it is possible to obtain a light emitting device with a longer service life.

A light emitting device of the invention has:
a light emitting element;
a metal member having an element mounting portion on which the light emitting element is mounted, and a flat portion disposed around the periphery of the element mounting portion; and
a translucent sealing member that seals the light emitting element and a part of the metal member,
the sealing member has a main body portion that seals the light emitting element and the metal member, a convex portion disposed on the main body portion, and a flange portion disposed around the periphery of the main body portion, the flange portion is disposed outside the range illuminated by light emitted from the light emitting element, and the flat portion of the metal member is bent toward the bottom face side of the light emitting device at least within the flange portion.

Also, another light emitting device of the invention has:
a light emitting element;
a metal member having an element mounting portion on which the light emitting element is mounted, and a flat portion disposed around the periphery of the element mounting portion; and
a translucent sealing member that seals the light emitting element and a part of the metal member, (2) the sealing member has a main body portion that seals the light emitting element and the metal member, a convex portion disposed on the main body portion, and a flange portion disposed around the periphery of the main body portion,
the flat portion of the metal member is bent toward the bottom face side of the light emitting device, and further bent toward the side face side of the light emitting device at least within the flange portion, or (3) the sealing member has a main body portion that seals the light emitting element and the metal member, a convex portion disposed on the main body portion, and a flange portion disposed around the periphery of the main body portion,
the flange portion is such that the height of an upper face thereof from the bottom face of the light emitting device substantially coincides with the height of an upper face of the flat portion of the metal member.

As a result of diligent research conducted into more efficient extraction of light from a light emitting element, the inventors turned their attention to the shape of the sealing member used to fix and seal the metal members, and perfected the present invention upon tracking down the places where the condensing of light on the convex portion could be impaired, finding a light emitting device configuration with which light can be better condensed on convex portion while ensuring good fixing and sealing of the metal members.

With the light emitting device of the present invention, light can be extracted more efficiently, and it is possible to obtain a high-quality light emitting device with a longer service life.

BRIEF DESCRIPTION OF THE DRAWINGS

Referring now to the attached drawings which form a part of this original disclosure.

DETAILED DESCRIPTION OF THE PREFERRED EMBODIMENTS

Figure 1A:
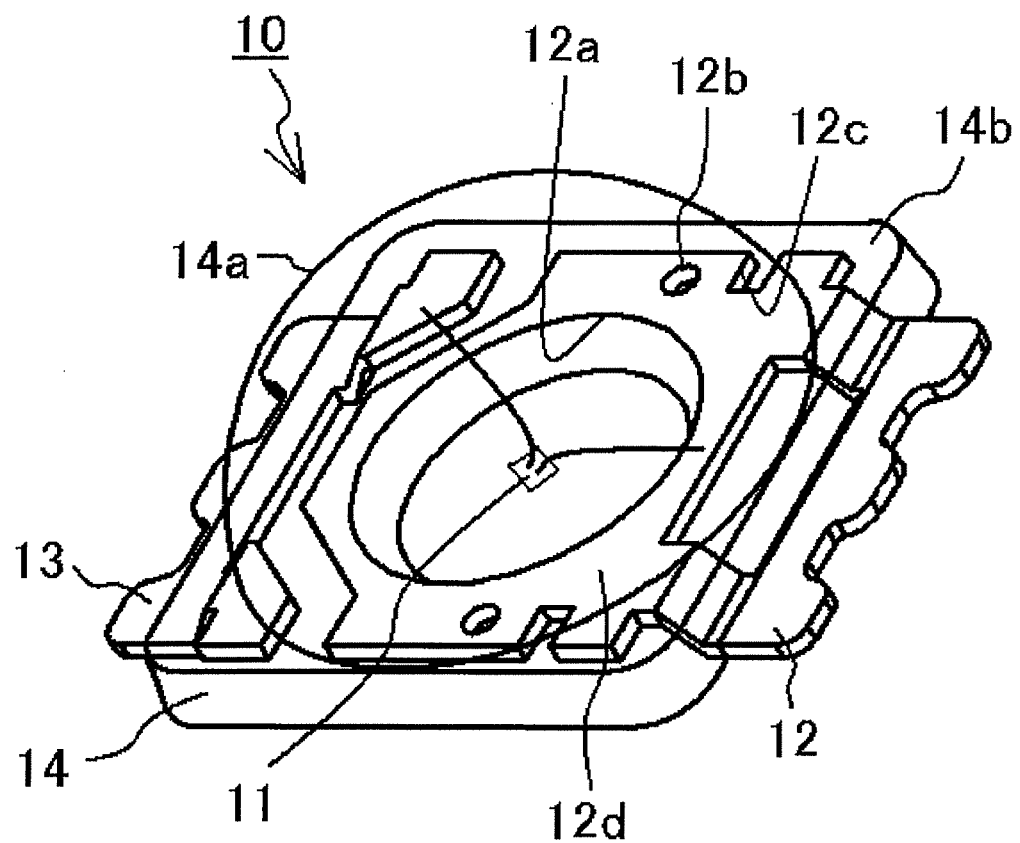
FIG. 1A is an oblique view of the light emitting device according to the one embodiment of the present invention.

The light emitting device of the present invention is mainly constituted by a light emitting element, a metal member, and a translucent sealing member.

In the following description, "upper face" refers to the face of the light emitting device on the side where light is extracted, "bottom face" refers to the face on the opposite side from the upper face, and "the bottom face of the light emitting device" refers to the bottom face of the sealing member main body portion constituting the light emitting device.

(Light Emitting Element)

The light emitting element is a semiconductor light emitting element, but may be any kind of element that is known as a light emitting diode. Examples thereof include one in which a laminated structure containing a light emitting layer is formed by any kind of semiconductor such as nitride semiconductor, InN, AlN, GaN, InGaN, AlGaN, InGaN, group III-V compound semiconductor, group II-VI compound semiconductor, and the like on the substrate.

Examples of substrates include insulating substrates such as spinel ($MgAl_2O_4$) or sapphire whose main plane is either the C plane, the A plane, or the R plane; silicon carbide (6H, 4H, 3C), silicon, ZnS, ZnO, GaAs, diamond; lithium niobate, neodymium gallate, or another such oxide substrate, nitride semiconductor substrate (GaN, Aln, etc.).

Examples of the structure of the semiconductor include an MIS junction, a PIN junction, a PN junction, or another such homostructure, or one with hetero bonds or double hetero bonds.

The various semiconductor layers that make up the light emitting element may be doped with silicon, germanium, or another such donor impurity and/or zinc, magnesium, or another acceptor impurity.

The light emitting layer may have a single quantum well structure or may have a multiple quantum well structure formed in a thin film that produces a quantum effect.

The emission wavelength of the light emitting element can be varied from the ultraviolet band to red by varying the material of the semiconductor, the mixed crystal ratio, the indium content of the InGaN in the light emitting layer, or the type of impurity with which the light emitting layer is doped.

This light emitting element is mounted on the upper face of a metal member as discussed below. A bonding member is usually used to mount the light emitting element on the metal member upper face. For instance, with a light emitting element which emits blue and green light and in which a nitride semiconductor is grown on a sapphire substrate, an epoxy resin, silicone, or the like can be used. Also, taking into account degradation caused by heat or light from the light emitting element, the rear face of the light emitting element may be plated with aluminum, or no resin may be used, and eutectic Au—Sn or another such solder, a low-melting point metal, or another such brazing material may be used. Furthermore, when a light emitting element made of GaAs or the like in which electrodes are formed on both sides, as with a light emitting element that emits red light, die-bonding may be performed with silver, gold, palladium, or another such conductive paste.

With the light emitting device of the present invention, just one light emitting element may be mounted, or two or more may be mounted.

Also, the light emitting element may be mounted on the metal member via a support member (sub-mount). For example, a support member with ceramic is formed by molding in the desired shape and then being calcined. Conductive wiring that is connected to the light emitting element is provided on the upper face side of the support member. The conductive wiring is usually formed, for example, by vapor deposition or sputtering and photolithography, or printing, or electroplating, or another such method. The conductive wiring may be provided inside the support member. The conductive wiring is formed, for example, from a paste-like material in which a resin binder contains tungsten, molybdenum, or another such high-melting point metal. Screen printing or another such method may be used to arrange a paste-like material in the desired shape via through-holes provided to a green sheet, and then firing this product to form a ceramic support member and conductive wiring that is disposed in the interior or on the surface of the support member. Also, the support member may be insert-molded from resin, using a pair of positive and negative electrodes as the conductive members. A light emitting element may be mounted on the upper face of this support member, and electrically connected to the conductive wiring of the support member. When a support member such as this is used, the conductive wiring of the support member is electrically connected with the metal member as discussed below.

The light emitting element may also be mounted face down.

(Metal Member)

The metal member is usually electrically connected to the light emitting element and, if desired, a protective element or the like (hereinafter also referred to as "light emitting element, etc."), and generally functions as a lead electrode and as a mount for the light emitting element, etc. Part of the metal member is embedded along with the light emitting element, etc., inside a sealing member as discussed below. Accordingly, the metal member comprises a portion that functions as a mount for the light emitting element, etc. and/or as a lead electrode within the sealing member (such as an internal electrode), and a portion that functions to electrically connect with the outside and extends outside the sealing member (such as an external electrode). Therefore, the metal member has an element mounting portion and a flat portion. The element mounting portion is a portion that functions as a mount for the light emitting element.

Therefore, there are no particular restrictions on the metal member so long as these functions can be realized, but forming the member from a material with relatively high thermal conductivity is preferable. Forming from a material such as this allows the heat generated by the light emitting element to be efficiently dissipated. For example, a material that has a thermal conductivity of at least about 200 W/(m·K), that has relatively high mechanical strength, and that can be easily punched out in a press, etched, or otherwise worked is preferable. Examples include copper, aluminum, gold, silver, tungsten, iron, nickel, and other such metals, iron-nickel alloy, phosphor bronze, ferrous copper, and other such alloys, and these materials whose surface has been plated with a film of silver, aluminum, copper, gold, or another such metal. The surface of the metal member is preferably smooth in order to improve reflectance. The metal member is usually formed in a uniform thickness, but some parts may be a thicker or thinner.

There are no particular restrictions on the shape of the metal member, which can be suitably determined by taking into account the shape of the light emitting device, the number of light emitting elements, their arrangement, the amount of space in which they can be arranged, and other such factors.

The element mounting portion is preferably flat in order for light to be efficiently emitted from the upper face of the light emitting element. Also, the metal member may have a concave shape portion which has been formed into a concave shape, and the bottom face of this concave shape portion may serve as the element mounting portion. Forming a concave shape portion ensures that the light emitting element will be disposed at the proper place, and also ensures the stability of the sealing of the sealing member. Also, the reflection of light at the side faces of the concave shape portion will direct light emitted laterally from the light emitting element toward the upper face side of the light emitting device, and this will improve the efficiency at which light is extracted to the upper face of the light emitting device.

The concave shape portion may have a bottom face area at least large enough for the light emitting element to be mounted, and can be, for example, circular, elliptical, a shape in which the corners of a polygon are rounded, or a modified shape based on one of these shapes. The size and depth of the concave shape portion is suitably such that light emitted from the light emitting element and this light that has been reflected will not be blocked when the light emitting element is mounted at the proper location inside the concave shape portion. In particular, it is preferable if the size and depth are such that light emitted from the light emitting element and reflected light are not blocked by the side faces, the upper edges, etc., of the concave shape portion. For example, it is good for the size of the bottom face of the concave shape portion to be larger than the area occupied by the light emitting element, and even better to be at least about 1.2 times the occupied area. It is also good for the depth to be at least equal to the height of the light emitting element, and preferably about 0.1 mm or more and about 0.5 mm or less.

The side faces of the concave shape portion may be vertical, but are preferably inclined toward the bottom face so as to be narrow. For instance, it is good for them to be inclined by about 0 to 45°, and preferably 20 to 40°, in the normal direction with respect to the bottom face. This allows light from the light emitting element to be efficiently guided to the upper face. Furthermore, on the concave shape portion, the surface extending from the side walls to the flat part (discussed below) of the outer perimeter of the concave shape portion is preferably rounded. Rounding off the corners in this way prevents the sealing member as discussed below from peeling by suppressing the cracking in the sealing member at the edges of the opening in the concave shape portion.

Figure 1B:
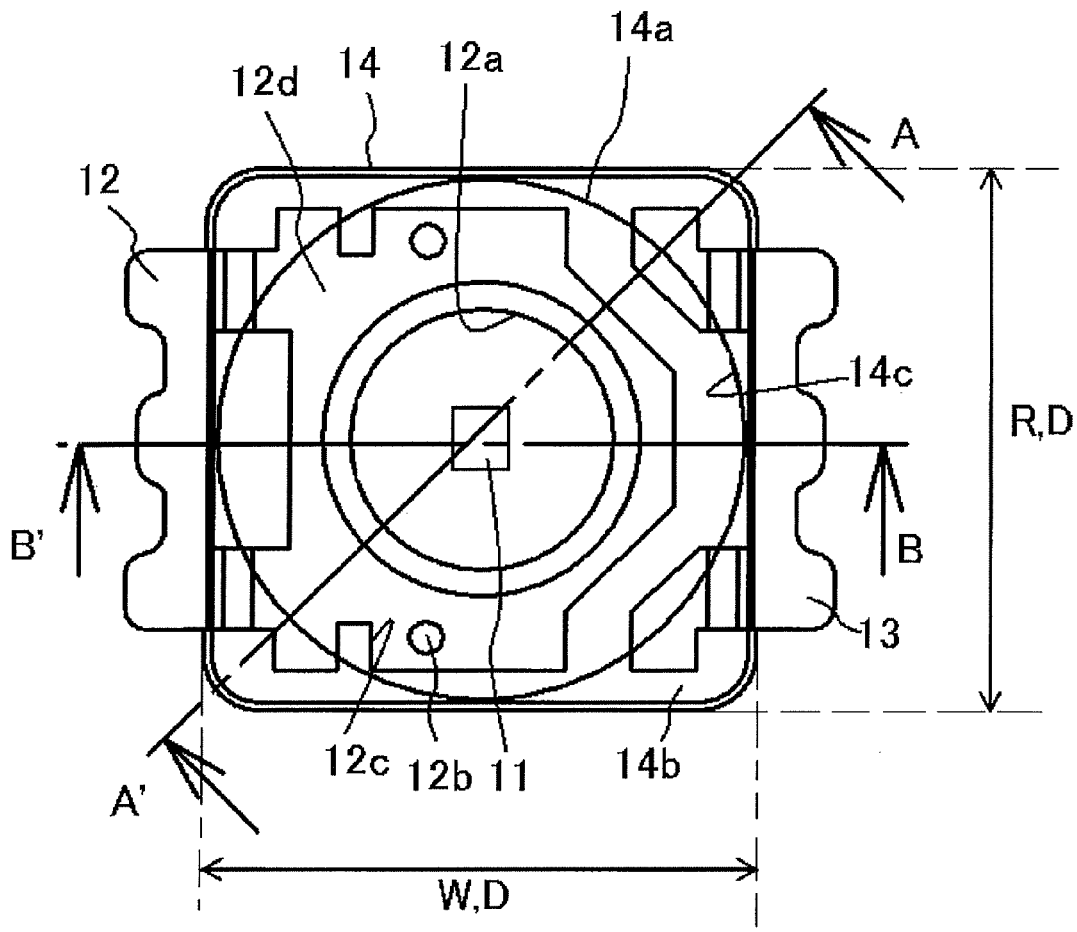
FIG. 1B is a plan view of the light emitting device of shown in FIG. 1A.

The metal member is such that the flat portion is disposed so as to surround the periphery of the element mounting portion (such as the concave shape portion). In particular, if the element mounting portion is a concave shape portion, light that is moving laterally from the light emitting element can be reflected by the side faces of the concave shape portion, so a flange portion can be easily disposed out the range illuminated by light emitted from the light emitting element. Also, a region can be ensured for mounting the above-mentioned protective element and so forth. Furthermore, the flat portion is preferably formed continuously from the main body portion to the flange portion in a width that is larger than the element mounting portion. Here, if a through-hole is provided at the position where the flat portion is bent as shown in FIG. 1B, it will be easier to inject the sealing member onto both sides of the metal member, and this improves the adhesion between the metal member and the sealing member. This through-hole is preferably disposed from the main body portion to the flange portion.

The flat portion may be present in the same plane as the element mounting portion, but if the element mounting portion has a concave shape as discussed above, the flat portion is disposed at a different height from that of the bottom face of the concave shape portion.

There are no particular restrictions on the planar shape of the flat portion surrounding the periphery of the concave shape portion, but as discussed above, for example, the shape can usually be circular, elliptical, a shape in which the corners of a polygon are rounded, or a modified shape based on one of these shapes, and is similar to the shape of the adjacent concave shape portion (that is, a shape that is the same or substantially the same, or a corresponding shape). This allows the sealing member that seals the light emitting element to be formed stably in a shape that conforms to the outer periphery of the concave shape portion. The outer contour of the flat portion can usually be a shape in which the corners of a polygon are rounded, or a modified shape based on such a shape, and is similar to the planar shape of the sealing member (that is, a shape that is the same or substantially the same, or a corresponding shape). This affords higher strength in the sealing member, and particularly the flange portion.

It is good for the other part of the flat portion to have a shape that extends to the opposite side from that of the part having a shape similar to the above-mentioned concave shape portion, in order to create a region that functions as a so-called internal terminal and/or external terminal. The width of this can be set as desired according to the performance to be obtained in the light emitting device and so forth, but is preferably the same as or slightly larger than the diameter of the concave shape portion, for example.

A second metal member that is paired with the element mounting portion is preferably located opposite the metal member having the element mounting portion. The metal member and the second metal member serve as a pair of positive and negative electrodes. The second metal member has a flat portion, and the light emitting element is connected by a wire to the flat portion of the second metal member. Consequently, when the light emitting element is mounted on the element mounting portion, the length of the wire between the light emitting element and the second metal member can be shorter, which prevents wire breakage and the like.

The second metal member is preferably disposed as an internal terminal opposite the element mounting portion of the above-mentioned metal member, and as an external terminal in a shape extending in a specific direction.

The part of the flat portion having a shape similar to the concave shape portion is preferably disposed opposite the second metal member.

Figure 1C:
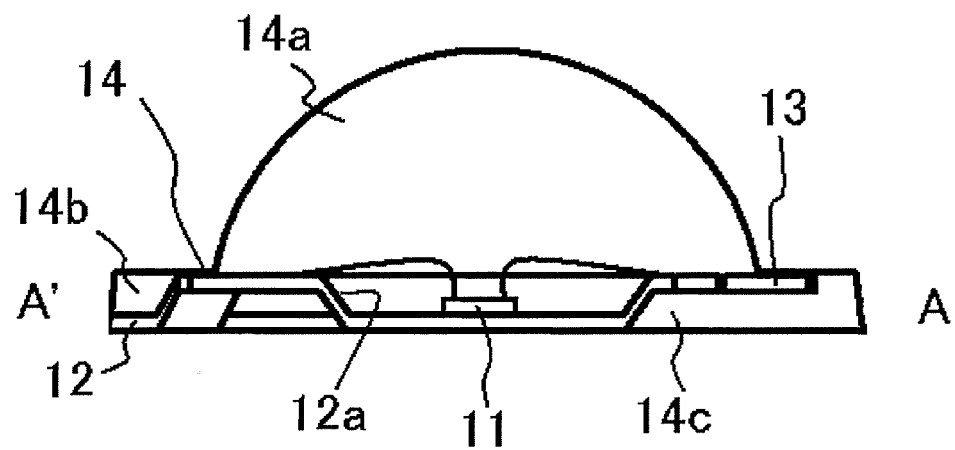
FIG. 1C is a cross-sectional view taken along the A-A' line of the light emitting device of shown in FIG. 1B.
Figure 1D:
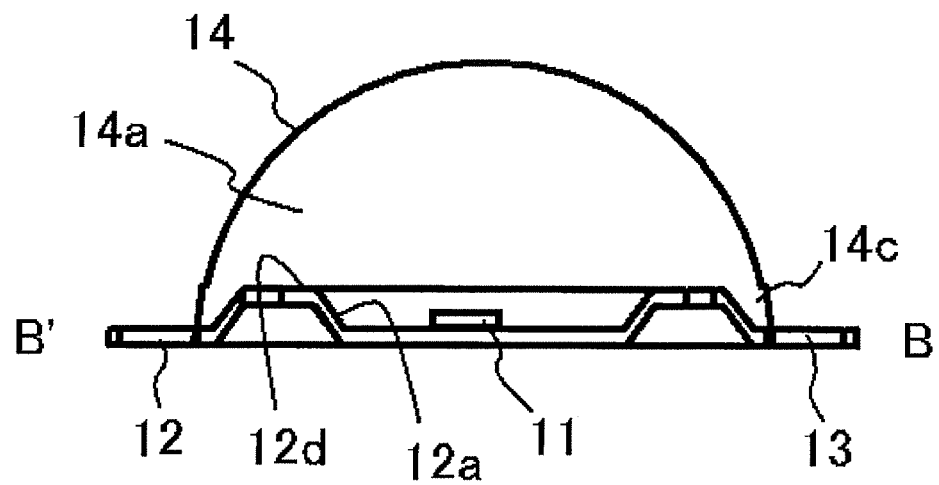
FIG. 1D is a cross-sectional view taken along the B-B' line of the light emitting device of shown in FIG. 1B.

The metal member and second metal member do not need to protrude outside from the same face (in the same direction) of the sealing member as discussed below, and can protrude outside from a plurality of different faces (directions). For example, all the distal ends (that is, the external terminal) of the metal member and the second metal member may be bent in the bottom face direction of the light emitting device, or each distal end may be bent in opposing side face directions. The metal member is preferably bent toward the bottom face direction of the light emitting device inside the sealing member. Depending on how wide the metal member is, the portion bent in the bottom face direction is preferably disposed within the flange portion. As shown in FIGS. 1A to 1C, the rear face of the flat portion of the metal member (the face on the bottom face side of the light emitting device) is covered by the sealing member. As a result, bending of the metal member increases the contact surface area between the sealing member and the metal member present inside the sealing member, and this prevents peeling of the sealing member. The bent portion of the metal member acts as a retainer, allowing separation between the sealing member and the metal member to be effectively prevented. Preferably, the metal member is bent toward the bottom face of the light emitting device, after which it is further bent in the side face direction inside the sealing member, and thereby made to protrude outside the sealing member. This better prevents the above-mentioned peeling and separation.

When the metal member protrudes from the side face of the sealing member, it is good if the bottom face of the metal member at the protruding location (that is, part of the flat portion) matches up with the bottom face of the sealing member, or in other words, if the bottom face of the light emitting device is in the same plane from the metal member all the way to the sealing member. To put this another way, the flat portion of the metal member is bent to the bottom face side of the light emitting device on the inside of the sealing member (flange portion), and protrudes from the side face, but as shown in FIGS. 1A to 1C, it is good if this bent portion is encompassed by the sealing member (flange portion), and is suitably formed without any steps from the metal member all the way to the sealing member on the bottom face of the light emitting device. This is because the sealing member can be reinforced by the metal member, and the strength of the light emitting device itself can be increased.

Also, when the metal member has a concave shape portion as the element mounting portion, the flat portion of the metal member may be bent and have a height step so as to be larger than the depth of the concave shape portion, but it is preferable if it is bent and has a height step so as to match up with the depth of the concave shape portion. The bottom face of the flat portion is preferably in substantially the same plane as the bottom face of the sealing member, which improves the strength of the bottom face of the light emitting device. Even more preferably, the bottom faces of both the flat portion and the concave shape portion are in substantially the same plane as the bottom face of the sealing member. This improves the strength of the bottom face of the light emitting device, and affords better reliability. Here, the bottom faces of the flat portion and the concave shape portion are preferably exposed from the sealing member. This improves heat dissipation, and furthermore allows the exposed portion of the flat portion to be utilized as an external terminal.

The flat portion of the metal member preferably has formed in its surface a cut-out or a recess or hole (hereinafter also referred to as "recess, etc.") that anchors or determines the formation of the sealing member. The recess, etc., or the cut-out may allow the sealing member to be disposed inside and increase the contact surface area between the two, or fix part of the sealing member, etc. This further improves the adhesion between the metal member and the sealing member.

There are no particular restrictions on the planar shape, layout, size, depth, and so forth of the recess, etc., and the cut-out, and can be suitably adjusted as dictated by the size of the light emitting device, the material used for the sealing member, and so on. The recess, etc., and the cut-out are preferably disposed outside the range of illumination by light from the light emitting element, as this will prevent the escape of light.

The metal member usually is electrically connected with the light emitting element, and optionally a protective element, by wire bonding. It is preferable if the wire has good ohmic properties with the electrodes of the light emitting element, or has good mechanical connectability, or has good electrical conductivity and thermal conductivity. The thermal conductivity is preferably at least about 0.01 cal/S·cm$^{2 \cdot \circ}$ C./cm, with at least about 0.5 cal/S·cm$^{2 \cdot \circ}$ C./cm being even better. When ease of work and so forth are taken into consideration, the wire diameter is preferably about 10 to 45 µm. Examples of this wire include gold, copper, platinum, aluminum, and other such metals and their alloys. The wire can be easily connected to the light emitting element and to the metal member used for wire bonding by using a wire bonding machine.

A single light emitting device may comprise two or more metal members (the above-mentioned first and second metal members). If the bottom faces of the metal members are substantially in the same plane as the bottom face of the sealing member, fewer metal members will be needed, there will be less offset in disposing the members in the same plane, and manufacturing will be easier.

The number of metal members may be equal to the number of light emitting elements mounted on the metal members plus one, or may be two or more times the number of light emitting elements mounted on the metal members. For example, if only one light emitting element is mounted, that light emitting element may be mounted on one of the metal members, an electrical connection may be made with one of the electrodes of the light emitting element, and the other metal member may be electrically connected with the other electrode of the light emitting element.

When two or more light emitting elements are mounted, some or all of the light emitting elements may be mounted on a single metal member and electrically connected, and other metal members may have separate electrical connections corresponding to the various light emitting elements. Or, each of the light emitting elements may be mounted on an individual metal member and electrically connected, and the other metal member may have separate electrical connections corresponding to the various light emitting elements. Thus mounting a plurality of light emitting elements and independently wiring so that each of the elements is electrically connected independently makes it possible to select various wiring patterns, such as serial or parallel, on the mounting face of the light emitting device, and this affords greater latitude in circuit design. Also, with independent wiring, it is easier to adjust the light emission intensity for the mounted light emitting elements, so this is particularly advantageous when using a plurality of light emitting elements having different emission colors, such as with full-color LEDs. In addition, the heat dissipation paths of the light emitting elements can be formed without overlap, so heat generated from the light emitting elements can be dissipated more uniformly, and as a result heat dissipation is better.

(Sealing Member)

Figure 2:
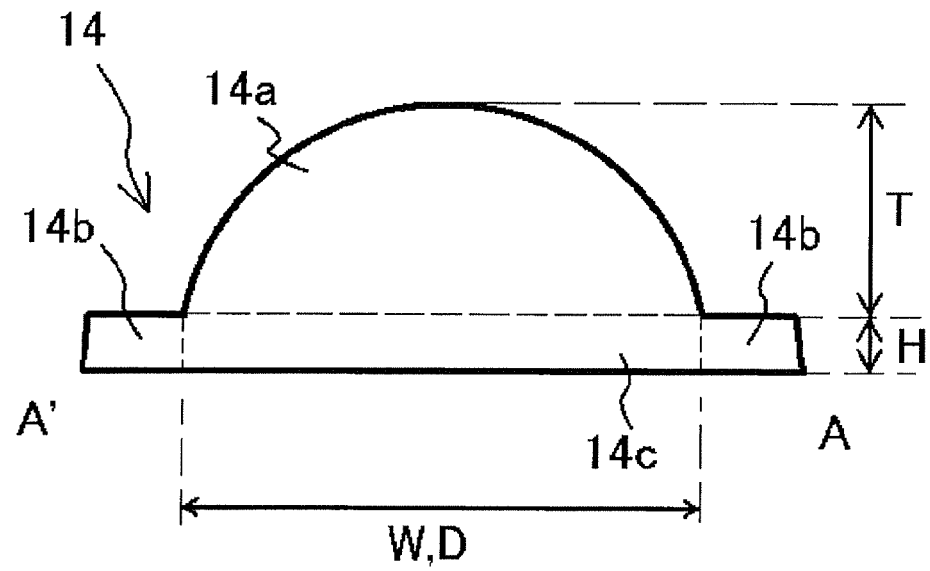
FIG. 2 is a cross-sectional view taken along the A-A' line of the light emitting device of shown in FIG. 1A illustrating the sealing member.

The sealing member seals the light emitting element, and optionally the protective element and part of the metal members, integrally and in block form, and has a main body portion, a convex portion, and a flange portion. That is, as shown in FIG. 2, which corresponds to a cross section along the A-A' line in FIG. 1B, the sealing member 14 mainly comprises a block-form main body portion 14c that integrally seals the light emitting element (not shown), etc., and part of the metal members (not shown), a portion called a convex portion 14a that is disposed in a shape that sticks out from the main body portion 14c above the main body portion 14c and the light emitting element (and its surrounding portions), and a portion called a flange portion 52 whose surface continues from the convex portion 14a and which is disposed around the outer periphery of the main body portion 14cb.

The light emitting device usually has the basic shape (the shape of the sealing member) of a circular cylinder, an elliptical cylinder, a sphere, an egg shape, a triangular column, a quadrangular column, a polygonal column, a shape similar to these, etc., and is generally in the form of a quadrangular column. Therefore, the sealing member in the present embodiment is constituted by a main body portion having the basic shape, with a convex portion that functions as a lens for collecting light, for example, integrally disposed on one face of the main body portion, and with a flange portion integrally disposed around the outer periphery of this main body portion.

The shape of the convex portion can be suitably adjusted as dictated by the light distribution of the light emitting device. Various shapes are possible, such as part of a sphere or an egg shape, or a polygonal bowl or dome shape whose bottom face is quadrangular, etc. A hemispherical shape or part of a sphere or egg shape is preferable. In particular, it is preferable if the convex portion is provided so that it is a circle-like inscribed in the outer shape of the flange portion in plan view. The result of this is that the size of the light emitting device itself can be kept to a minimum, while the size of the convex portion can be increased, and an adequate flange portion size can be ensured, so the resulting light emitting device will be easier to handle, such as being able to carry it by the flange portion.

The convex portion preferably has a shape such that its center is located near the center of the light emitting element or the light emitting element mounting portion.

Figure 1E:
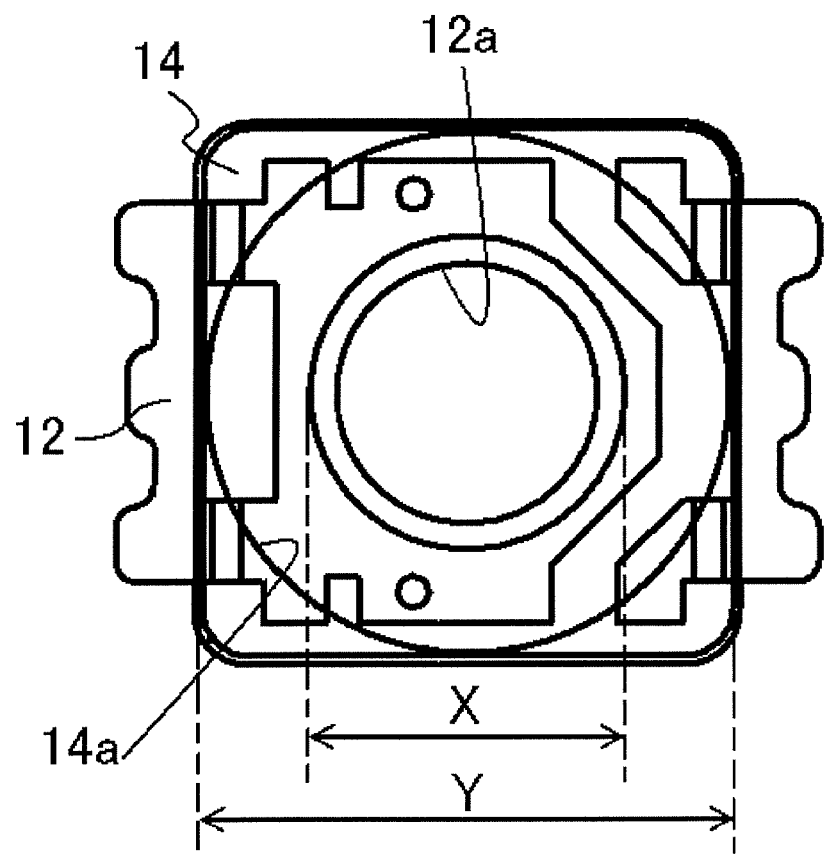
FIG. 1E is a plan view of the light emitting device of shown in FIG. 1A illustrating dimension of a convex portion and a concave shape portion.

As shown in FIG. 1E, the convex portion 14a is preferably larger than at least an element mounting portion 12a, and if a concave shape portion is provided to the metal member 12, the convex portion 14a is preferably larger than this concave shape portion. For example, the diameter (Y in FIG. 1E) of the convex portion 14a in plan view is preferably about 1.5 to 2 times the diameter (X in FIG. 1E) of the upper end of the concave shape portion. Making the convex portion larger in size increases the light extraction efficiency.

For example, as shown in FIGS. 1B and 2, the sealing member is such that the main body portion 14c has a width W, a depth R, and a height H, the convex portion 14a has diameter D and a height T at the positions of maximum value, and the flange portion 14b has the same height as the main body. Here, there are no particular restrictions on the width W, the depth R, the diameter D, or the heights H and T, but it is preferable, for example, for the diameter D of the convex portion to be about the same as the width W and/or the depth D of the main body. The height T of the convex portion is preferably about 1 to 10 times the height H of the main body, and more preferably about 5 to 10 times. More specifically, examples include a width W of about 1 to 10 mm, a depth R of about 1 to 10 mm, a height H of about 0.05 to 5 mm, a diameter D of about 1 to 10 mm, and a height T of about 0.5 to 6 mm. Also, examples preferably include a width W of about 2 to 7 mm, a depth R of about 2 to 7 mm, a height H of about 0.1 to 1 mm, a diameter D of about 2 to 7 mm, and a height T of about 1 to 3 mm. It is particularly favorable for the width W and the depth R of the main body to be substantially the same (such as within a range of ±5%). This allows the light distribution in the width direction to be substantially the same as the light distribution in the depth direction. It is preferable here if the width and depth of the convex portion are substantially the same.

When a plurality of light emitting elements is mounted on the element mounting portion, the size of the convex portion is preferably larger than that of the element mounting portion. Usually, for light to be extracted more efficiently, the convex portion is designed such that its center is the location of the light source, but when a plurality of light emitting elements are mounted, there are a plurality of light source points within the element mounting portion, so there are light sources at locations away from the center of the convex portion, and this make it difficult to obtain the desired light extraction efficiency. In view of this, the degree of offset from the center of the convex portion of the light emitting element serving as the light source can be kept relatively small, and it is possible to get closer to the desired light extraction efficiency by making the convex portion larger than the element mounting portion. This is particularly pronounced when the convex portion has a hemispherical shape.

The flange portion does not necessarily have to be disposed all the way around the convex portion. If the flange portion is disposed only around part of the convex portion, then flange portions of substantially the same shape are preferably disposed at regular intervals around the convex portion. For example, the flange portions may be provided at the four corners (preferably two mutually opposing pairs) of the sealing member so as to protrude from the convex portion. This allows the size of the light emitting device itself to be kept to a minimum while allowing the convex portion to be larger.

It is good if the sealing member is formed so that the flange portion can be disposed outside the range of illumination of the light emitted from the light emitting element, regardless of whether or not the metal member has an element mounting portion with a concave shape, and preferably the flange portion is disposed more in the bottom face direction (downward) than the range of illumination of the light from the light emitting element. The "range of illuminated by the light from the light emitting element" is the range over which light emitted from the light emitting element reaches directly. More specifically, it can be defined by a straight line connecting the light emitting layer of the light emitting element and its surrounding light blocking member (such as the metal member). The upper face of the light emitting element may serve as a reference.

In particular, when the light emitting element is mounted on an element mounting portion with a concave shape, the range of illumination by the light is defined by the shape and size of the concave shape portion of the metal member and other such factors, but it is good if the surface of the flange portion is disposed as close as possible to the flat portion of the metal member so that the flange portion will not be disposed at a location through which light emitted from the light emitting element passes, and will be disposed outside the region reached by light. That is, it is good to cover the light emitting element, etc. and the metal member so that the height of the flange portion upper face from the bottom face of the light emitting device is substantially the same as the height of the upper face of the flat portion of the metal member, or in other words, is in substantially the same plane. The phrase "the height is substantially the same" here means that the upper face of the metal member present inside the metal member in plan view is not exposed from the sealing member, but is covered in the minimum covering thickness, and when viewed from the side face, there only this minimum amount of height differential. Similarly, "in substantially the same plane" means that the height differential is limited to the minimum covering thickness, and the result is that the portions lie in the same plane or essentially in the same plane. Here, "minimum covering thickness" refers, for example, to a degree that can be attained in the manufacturing process, and more specifically, an example is about 50 to 100 μm, with about 70 to 80 μm being preferable. From a different standpoint, the thickness is preferably about ⅕ to ¹⁄₁₀, and more preferably about ⅕ to ⁴⁄₇, the height of the flange portion of the sealing member. Moisture, ionic impurities, and the like can work their way in through the gap between the metal member and the sealing member, so thus covering the upper face of the metal member with the sealing member prevents the incursion of moisture, ionic impurities, and the like at the upper face of the light emitting device, and improves the reliability of the light emitting device.

Disposing/forming the flange portion in this way ensures the proper contact surface area between the sealing member and the metal member, and thereby prevents them from peeling, while not impeding light from the light emitting element by the sealing member disposed on the metal member upper face, so that light can be extracted as efficiently as possible. Also, since the strength of the sealing member at the flange portion is increased by this metal member, the flange portion can be formed relatively thin while still maintaining sufficient strength, so the overall thickness of the light emitting device can be reduced. When the flange portion is thus disposed outside the range of illumination of light emitted from the light emitting element, the convex portion surface can serve as the main light extraction face, so in handling the light emitting device, pincettes or other such tools will come into contact with the flange portion rather than the main light extraction face. Consequently, damage or deformation of the main light extraction face of the light emitting device can be prevented, and this prevents changes in light distribution characteristics and a decrease in optical output.

Also, when the metal member has an element mounting portion with a concave shape, it is good if the bottom face of the main body portion of the sealing member is disposed so that the bottom face of the concave shape portion is exposed, and preferably this is disposed so as to lie in substantially the same plane as the bottom face of the concave shape portion. Thus exposing the element mounting portion allows heat from the light emitting element to be dissipated more effectively. As a result, degradation of the light emitting element and the sealing member by heat and so forth can be prevented, and the reliability of the light emitting device can be enhanced. Also, the bottom face of the light emitting element can be reinforced by the metal member if the bottom face of the sealing member lies in substantially the same plane as the bottom face of the concave shape portion.

Therefore, the height H of the flange portion and the main body portion is preferably slightly greater than (such as +100 μm) the thickness of the metal member combined with the depth of the concave shape portion.

The material for the sealing member is selected to ensure good electrical insulation of the light emitting element and the metal member. Examples include resin such as a silicone resin, a polyphthalic amide (PPA), a polucarbonate resin, a polyphenylene sulfide (PPS), a liquid crystal polymer (LCP), an ABS resin, an epoxy resin, a phenol resin, an acrylic resin, a PBT resin, ceramics, and the like, for example. Of these, a translucent silicone resin is preferable. This is so that the sealing member will be heat resistance, able to withstand high temperatures over 200° C., and will deform and decompose only slowly at even higher temperatures, that is, will have little temperature dependence and will have little effect on other members, so long-term reliability can be anticipated.

The sealing member is partially mixed the above material with various dyes, pigments or the like as colorant and dispersing agent. Examples include $Cr_2O_3$, $MnO_2$, $Fe_2O_3$, carbon black and the like as the colorant, and calcium carbonate, aluminum oxide, titanium oxide as the dispersing agent, for example.

(Translucent Covering Member)

With the light emitting device of the present invention, after the light emitting element has been mounted on the metal member, a translucent covering member may be disposed so as to cover the light emitting element. For example, when the metal member has an element mounting portion with a concave shape, a translucent covering member may be disposed on all or part of the concave shape portion so as to rise up from the concave shape portion.

The translucent covering member is preferably formed from a material that will protect the light emitting element against external force, moisture, and so forth, and will product the wires that ensure connection between the light emitting element and the metal member.

Examples of the material used for the translucent covering member include epoxy resin, silicone resin, acrylic resin, urea resin, combinations of these, and other such transparent resins with excellent weather resistance, glass, and so on. The translucent covering member is preferably made of the same material as the sealing member, has the same composition, etc., and may contain a diffusing agent or a fluorescent substance. Using the same member as the sealing member allows the coefficient of thermal expansion of the translucent covering member to be substantially the same as that of the sealing member, so the wires and the like disposed on the sealing member and the translucent covering member will have better impact resistance. Furthermore, since the refractive index will also be substantially the same, there will be less loss of light transmitted from the translucent covering member to the sealing member, and the light extraction efficiency can be improved. The translucent covering member can also be made of a different material, have a different composition, etc. In particular, with a transparent resin, even if the translucent covering member should absorb moisture during processing or storage, any moisture trapped in the resin can be released to the outside air by baking for about 14 hours or longer at about 100° C. Therefore, it is possible to prevent steam explosion and peeling between the light emitting element and the sealing member (discussed below). Also, in view of such factors as adhesion between the sealing member and the translucent covering member under the influence of heat produced from the light emitting element and so forth, a material whose coefficient of thermal expansion is close to that of the sealing member is preferably selected.

With the present specification, "translucent" means a property whereby at least about 70%, and preferably at least about 80%, and more preferably at least about 90%, and even more preferably at least about 95% of the light emitted from the light emitting element is transmitted.

A diffusing agent or a fluorescent substance may be added to the translucent covering member. A diffusing agent is used to diffuse light, lessen the directionality of light from the light emitting element, and increase the field angle. A fluorescent substance is used to convert light from the light emitting element, and can convert the wavelength of light emitted from the light emitting element to outside the sealing member. If the light from the light emitting element is visible light with a short wavelength and high energy, examples of the various substances that can be used favorably include perylene derivatives (organic fluorescent substances), and ZnCdS:Cu, YAG:Ce, nitrogen-containing $CaO—Al_2O_3—SiO_2$ activated by europium and/or chromium, and other such inorganic fluorescent substances. With the present invention, when white light is obtained, and particularly when a YAG:Ce fluorescent substance is utilized, depending on the content thereof, white light can be formed reliably and relatively simply because it is possible to emit light from a blue light emitting element, and part of this light can be absorbed so that yellow (a complementary color) light can be emitted. Similarly, when a nitrogen-containing $CaO$—$Al_2O_3$—$SiO_2$ fluorescent substance activated by europium and/or chromium is utilized, depending on the content thereof, white light can be formed reliably and relatively simply because it is possible to emit light from a blue light emitting element, and part of this light can be absorbed so that red (a complementary color) light can be emitted.

The diffusing agent and fluorescent substance are preferably added only to the translucent covering member and not to the sealing member. The diffusing agent or fluorescent substance prevents the escape of light to the side face or bottom face side of the light emitting device caused by optical scattering. The translucent covering member can be formed by filling in a recess as discussed above, or may be formed only around the light emitting element by screen printing, electrophoresis deposition, or the like.

(Protective Element)

There are no particular restrictions on the protective element, and any known type that is installed in a light emitting device may be used. Examples include elements that can short circuit forward voltage of at least a specific level that is higher than the operating voltage of the light emitting element, namely, elements that protect against over-heating, over-voltage, over-current, or static electricity, and protective circuits. More specifically, a Zener diode, a transistor diode, or the like can be utilized.

With the light emitting device of the present invention, the protective element is preferably mounted outside the range of illumination by light emitted from the light emitting element. This suppresses light absorption at the protective element. Also, the protective element joining member can be prevented from flowing out toward the recess by mounting the protective element on the first metal member and at a location opposite the light emitting element with the recess in between. Usually only one protective element is mounted, but two or more may be mounted. Also, the protective element is preferably mounted on the first metal member (the metal member on which the light emitting element is mounted, but may be mounted on the second metal member.

(Other Parts)

With the light emitting device of the present invention, a reflecting member, an anti-reflection member, a light diffusing member, and various other such parts may also be provided so that light can be efficiently extraction from the light emitting element.

(Manufacturing Method)

The light emitting device of the present invention can be formed usually by, firstly, mounting the light emitting element, etc., on the metal member, after which placing the metal member in a plastic casting case filled with the material of the sealing member, and curing this material to integrally mold the member. The metal member on which the light emitting element, etc., are mounted is disposed in a metal mold, the mold is filled with the material of the sealing member, and this material is cured.

Examples of the light emitting device of the present invention will now be described in detail through reference to the drawings.

Embodiment 1

As shown in FIGS. 1A to 1D, the light emitting device 10 in this embodiment is a snap-mount type of light emitting device, in which a light emitting element 11 and parts of a metal member 12 and a second metal member 13 are integrally sealed together by a sealing member 14 composed of silicone resin.

The light emitting element 11 is formed as follows. An n-type contact layer composed of n-type GaN, a light emitting layer composed of a nitride semiconductor such as InN, AlN, GaN, InGaN, AlGaN, or InGaAlN, a p-type clad layer composed of p-type AlGaN or InGaN, and a p-type contact layer composed of p-type GaN are laminated in that order over a sapphire substrate, which forms an InGaN semiconductor that emits blue light with a dominant wavelength of approximately 470 nm.

The die bonding of the light emitting element 11 is accomplished, for example, using silver paste or epoxy resin. Electrodes formed on the light emitting element 11 (not shown) and the flat portion of the metal member 12 are connected by gold wires with a diameter of 30 μm.

The metal member 12 has an element mounting portion 12a with a concave shape for mounting the light emitting element 11, and a flat portion 12d is disposed around this. The concave element mounting portion 12a has a diameter of about 1.2 mm, for example.

Holes 12b and cut-outs 12c are formed in the flat portion 12d to afford a sufficient adhesion with the sealing member as discussed below.

The second metal member 13 is disposed so as to be opposite the element mounting portion 12a of the metal member 12.

The metal member 12 and the second metal member 13 are bent inside the sealing member 14, and particularly inside a flange portion 14b as discussed below toward the bottom face thereof at about 60°, and are further bent at about 60° toward the side face. Thus, the ends thereof protrude from the side faces of the sealing member 14 so as to lie in substantially the same plane as the bottom face of the light emitting device 10, and function as external terminals. The metal member 12 and second metal member 13 are formed by punching out process of a silver-plated copper sheet using press with a thickness of 0.4 mm, for example. The height differential produced by the two-step bending of the metal member 12 here is about 0.5 mm.

Although not depicted, the light emitting element 11 inside the concave element mounting portion 12a of the metal member 12 is embedded in a translucent covering member composed of a silicone resin containing a fluorescent substance (such as YAG:Ce) and a diffusing agent (such as titanium oxide). The translucent covering member is formed by potting.

The light emitting element 11, the metal member 12, and the second metal member 13 are sealed together by the sealing member 14. The sealing member 14 mainly embeds them integrally, and comprises a substantially rectangular parallelepiped main body portion 14c, a lens-shaped convex portion 14a disposed above the main body portion 14c and the light emitting element 11, and a flange portion 14b disposed around the outer periphery of the main body portion 14b.

The main body portion 14c of the sealing member 14 has a width W of about 5 mm, a depth R of about 5 mm, and a height H of about 0.5 mm. The diameter D of the convex portion 14a is about 5 mm, and the height T is about 2 mm.

The length of the light emitting device 10 along one side, that is, the length along one side of the main body portion 14c of the sealing member 14 (width W=depth R) is substantially the same as the diameter D of the convex portion. Therefore, in plan view the flange portion 14b is only disposed at four diagonally opposite places around the outer periphery of the main body portion 14c.

On everywhere but the convex portion 14a, that is, on the flange portion 14c, the upper face of the second metal member 13 and the flat portion 12d of the metal member 12 are covered with the sealing member 14, but this covering is adjusted to the minimum thickness, which is about 75 µm. When the film thickness is like this, that is, when the upper face of the flange portion 14 is disposed in substantially the same plane as the flat portion of the metal member 12, or when the height of the upper face of the flange portion 14 from the bottom face of the light emitting device substantially coincides with the height of the upper face of the flat portion 12d of the metal member 12, the disposition will be outside the range of light illumination, so light from the light emitting element will not be obstructed.

A simulation was conducted for emission efficiency and orientation strength using the light emitting device of the example described above. As a result, the light extraction efficiency was 95.2%. The half-value angle was 130°.

Meanwhile, as a comparative example, the same simulation as above was conducted using a light emitting device in which the length of the light emitting device along one side (the length along one side of the main body portion of the sealing member (width W=depth R)) was 5 mm (the same as above), and the diameter of the convex portion was about 3.5 mm, the convex portion was disposed in the center of the light emitting device, and the light emitting device had a flange portion all the way around the outer periphery of the main body portion, the height of the flange portion and the main body portion was about 0.85 mm, and a metal member was disposed in the approximate center thereof. As a result, the emission efficiency was 88.1%.

A comparison of the two sets of results confirmed that the light extraction efficiency with this example was approximately 8% better than in the comparative example.

With a light emitting device constituted as above, the light extraction efficiency can be increased. That is, with a light emitting device featuring a translucent sealing member, the sealing member covering the metal member transmits light from the light emitting element, so the light is extracted in a direction other than the front face direction, which is the light extraction face of the light emitting device. However, even though the sealing member is formed from a translucent material, some of the light is absorbed depending on the material of the sealing member, its shape, and so forth.

In contrast, with the light emitting device of the present embodiment, the sealing member on the metal member is kept as thin as possible at the flange portion of the sealing member, that is, the upper face of the flange portion is provided close to the flat portion of the metal member, and as a result the flange portion is disposed outside the range of illumination of light from the light emitting element, and this light does not pass through the flange portion before being extracted. As a result, the extraction of light from the light emitting element can be focused on the convex portion, which greatly improves the light extraction efficiency of the light emitting device.

Also, adhesion is improved between the sealing member and the metal member. That is, as discussed above, when the flange portion is provided closer to the flat portion, the flange portion ends up being thinner, so this can lead to a decrease in the strength of the flange portion and the adhesion between the sealing member and the metal member. In particular, the material of the translucent sealing member has higher elasticity than the material of the opaque sealing member, and there is a tendency toward deformation due to external force, elevated temperature, etc., so it is difficult to obtain a sufficiently strength and adhesion. If the adhesion between the metal member and the sealing member is not enough, a gap between the metal member and the sealing member will allow the incursion of moisture, ionic impurities, and so forth, which may diminish the reliability of the light emitting device.

In contrast, with the light emitting device of the present embodiment, the metal member is bent inside the sealing member, in particular in the flange portion, which increases the contact surface area between the sealing member and the metal member, and the bending also fixes the members more securely and improves the adhesion between the two. Also, the strength of the flange portion can be improved, and the reliability of the light emitting device can be enhanced. Furthermore, since the strength of the flange portion is maintained while it is formed relatively thin, the height of the light emitting device can be reduced.

Embodiment 2

Figure 3A:
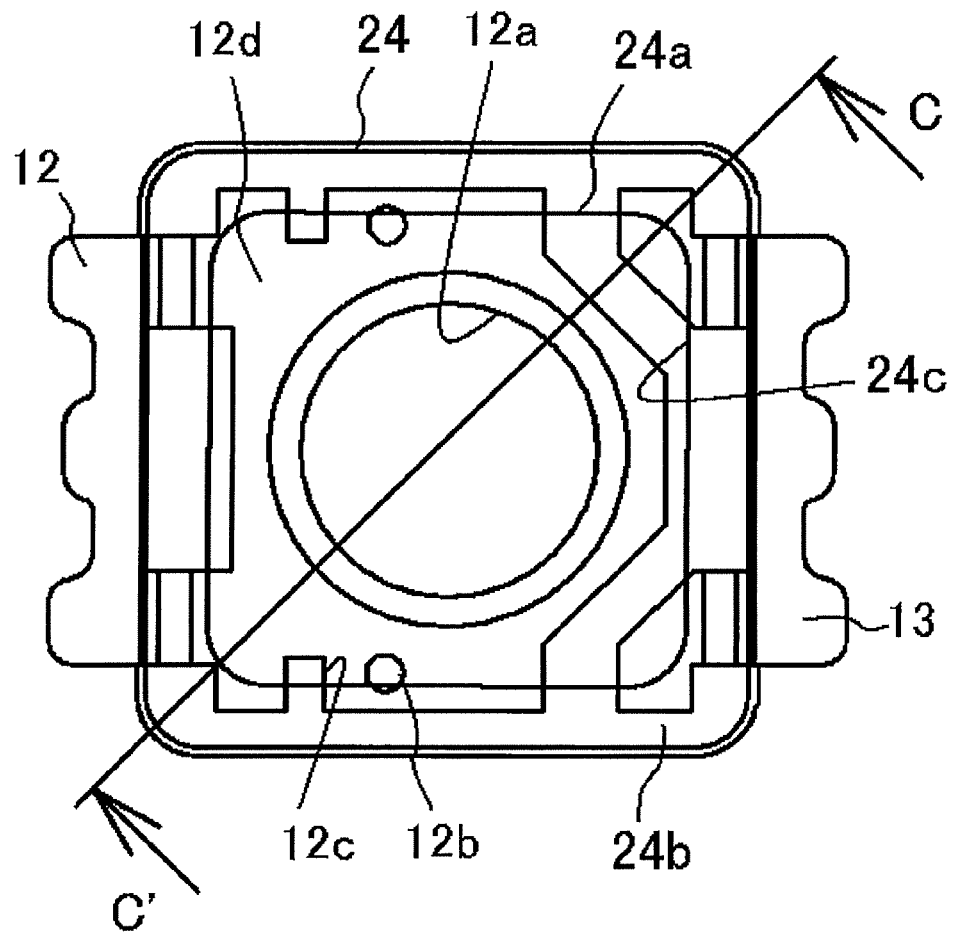
FIG. 3A is a plan view of the light emitting device according to another embodiment of the present invention.
Figure 3B:
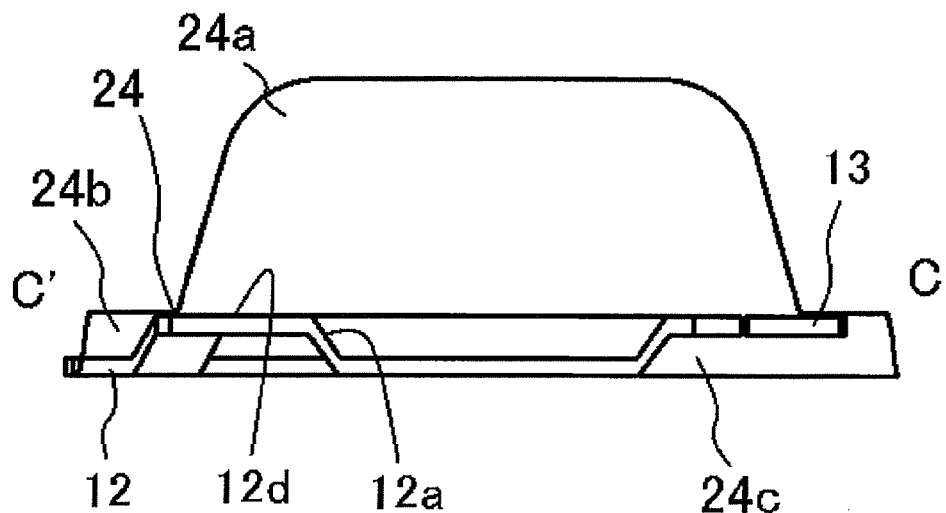
FIG. 3B is a cross-sectional view taken along the C-C' line of the light emitting device of shown in FIG. 3A.

The light emitting device in Embodiment 2 has substantially the same constitution as that in Embodiment 1, except that the bottom face of a convex portion 24a of a sealing member 24 (that is, the surface on the convex portion 24a side of a main body portion 24c) is in the form of a bowl that is substantially square, as shown in FIGS. 3A and 3B (the light emitting element is not shown). Thus disposing a flange portion 24b of substantially uniform width around the periphery of the convex portion 24a increases the strength of the flange portion 24b and improves the reliability of the light emitting device.

The convex portion 24a may also have a lens shape provided with a concave portion near the center.

Embodiment 3

Figure 4:
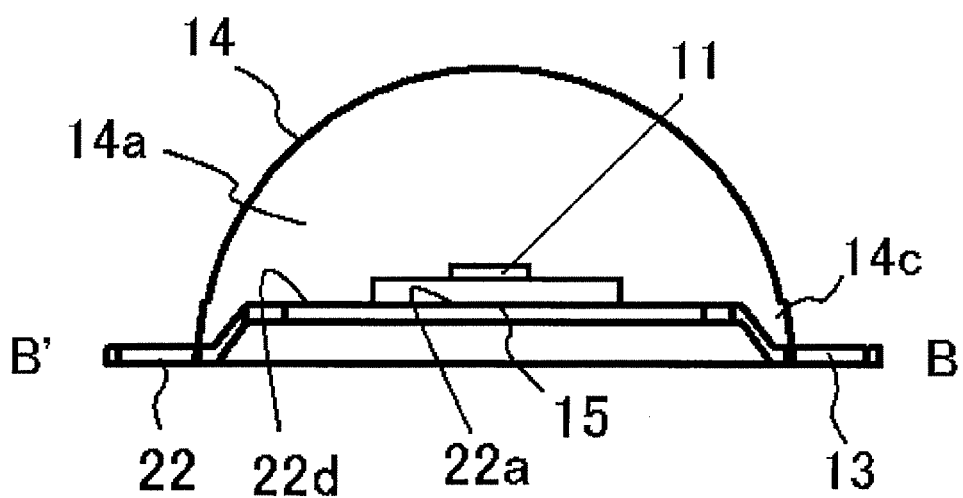
FIG. 4 is a schematic cross-sectional view of the light emitting device according to another embodiment of the present invention.

As shown in FIG. 4, the light emitting device in this embodiment has substantially the same constitution as that in Embodiment 1, except that an element mounting portion 22a of a metal member 22 does not have a concave shape, the light emitting element is mounted on a flat portion that is continuous with a flat portion 22d, and the light emitting element 11 is mounted via a support member 15. The upper face of the flange portion 14b is disposed at a location that is lower than the upper face of the support member 15.

Thus providing a support member results in the flange portion being disposed outside the range of illumination by light emitted from the light emitting element. The support member can be the same as that used in Embodiment 1.

With a light emitting device having this constitution, the half-value angle increases somewhat, but better emission efficiency is obtained.

Also, part of the flat portion may protrude inside the convex portion, and the element mounting portion may be disposed at a location that is higher than the flange portion. The support member can be omitted in this case.

Embodiment 4

Figure 5:
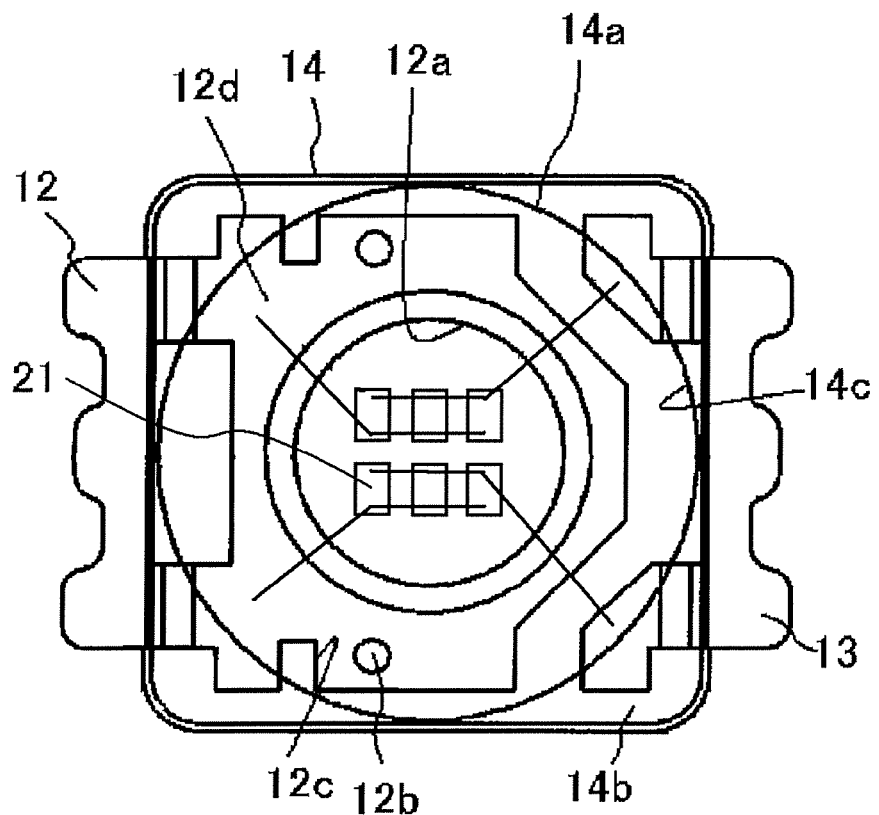
FIG. 5 is a schematic cross-sectional view of the light emitting device according to another embodiment of the present invention.

As shown in FIG. 5, the light emitting device in this embodiment has substantially the same constitution as that in Embodiment 1, except that six rectangular light emitting elements 21 are mounted on the element mounting portion 12a of the metal member 12, that is, there are two rows each containing three light emitting elements 21 connected in parallel, that six light emitting elements 21 are connected in parallel.

Embodiment 5

Figure 6:
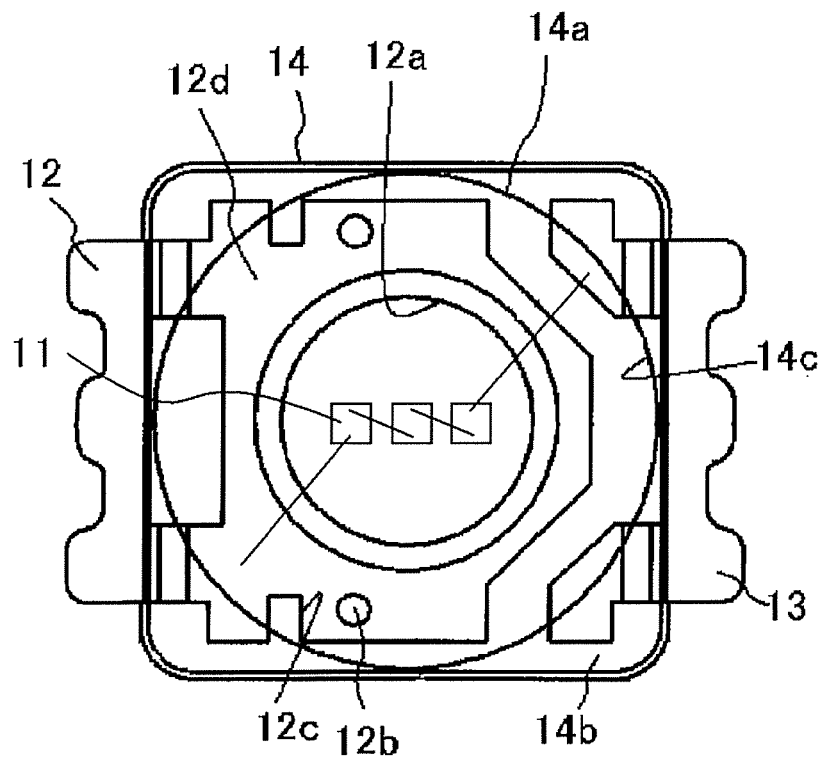
FIG. 6 is a schematic cross-sectional view of the light emitting device according to another embodiment of the present invention.
Figure 7:
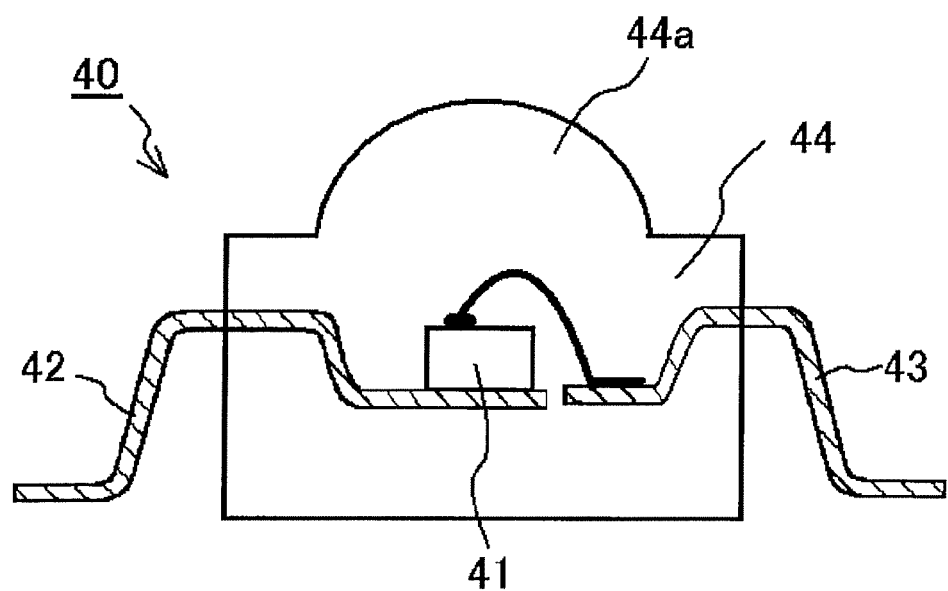
FIG. 7 is a schematic cross-sectional view of the conventional light emitting device.

As shown in FIG. 6, the light emitting device in this embodiment has substantially the same constitution as that in Embodiment 1, except that three square light emitting elements 11 are connected in series and mounted on the element mounting portion 12a of the metal member 12.

The present invention can be used in illumination light sources, various kinds of indicator-use light source, vehicle-mounted light sources, display-use light sources, liquid crystal backlight-use light sources, signaling devices, vehicle-mounted parts, signage-use channel letters, and various other light sources.

What is claimed is:

1. A light emitting device, comprising:
a light emitting element;
a metal member having an element mounting portion on which the light emitting element is mounted, and a flat portion disposed around the periphery of the element mounting portion; and
a translucent sealing member that seals the light emitting element and a part of the metal member,
the sealing member has a main body portion that seals the light emitting element and the metal member, a convex portion disposed on the main body portion, and a flange portion disposed around the periphery of the main body portion, the flange portion is disposed outside the range illuminated by light emitted from the light emitting element, and
the flat portion of the metal member is bent toward the bottom face side of the light emitting device at least within the flange portion.

2. The light emitting device according to claim 1, wherein the element mounting portion of the metal member is formed in a concave shape by bending toward the bottom face side of the light emitting device with respect to the flat portion.

3. The light emitting device according to claim 1, wherein the flat portion of the metal member is further bent toward the side face side of the light emitting device within the flange portion.

4. The light emitting device according to claim 3, wherein the flat portion bent toward the side face side of the light emitting device is such that a height of a lower face of the flat portion substantially coincides with a height of a bottom face of the light emitting device.

5. The light emitting device according to claim 2, wherein the bottom face of the element mounting portion having a concave shape is exposed from the sealing member.

6. The light emitting device according to claim 1, wherein the flange portion of the sealing member is such that a height of an upper face thereof from a bottom face of the light emitting device substantially coincides with a height of an upper face of the flat portion of the metal member.

7. The light emitting device according to claim 1, wherein the flat portion is disposed so as to surround the periphery of the element mounting portion, and a through hole is formed thereon at least within the main body portion.

8. A light emitting device, comprising:
a light emitting element;
a metal member having an element mounting portion on which the light emitting element is mounted, and a flat portion disposed around the periphery of the element mounting portion; and
a translucent sealing member that seals the light emitting element and a part of the metal member,
the sealing member has a main body portion that seals the light emitting element and the metal member, a convex portion disposed on the main body portion, and a flange portion disposed around the periphery of the main body portion,
the flat portion of the metal member is bent toward the bottom face side of the light emitting device, and further bent toward the side face side of the light emitting device at least within the flange portion.

9. A light emitting device, comprising:
a light emitting element;
a metal member having an element mounting portion on which the light emitting element is mounted, and a flat portion disposed around the periphery of the element mounting portion; and
a translucent sealing member that seals the light emitting element and a part of the metal member,
the sealing member has a main body portion that seals the light emitting element and the metal member, a convex portion disposed on the main body portion, and a flange portion disposed around the periphery of the main body portion,
the flange portion is such that a height of an upper face thereof from a bottom face of the light emitting device substantially coincides with a height of an upper face of the flat portion of the metal member.

10. The light emitting device according to claim 8, wherein the flat portion of the metal member has a through hole within the convex portion in plan view, and is bent toward the bottom face side of the light emitting device within the flange portion which is adjacent to the through hole and further toward the side face side of the light emitting device.

11. The light emitting device according to claim 9, wherein the flat portion of the metal member has a through hole within the convex portion in plan view, and is bent toward the bottom face side of the light emitting device within the flange portion which is adjacent to the through hole and further toward the side face side of the light emitting device.

12. The light emitting device according to claim 1, wherein the flange portion is provided at the four corners of the sealing member so as to protrude from the convex portion in plane view.

13. The light emitting device according to claim 1, wherein the convex portion is provided so that it is a circle-like inscribed in the outer shape of the flange portion in plan view.

14. The light emitting device according to claim 12, wherein the convex portion is provided so that it is a circle-like inscribed in the outer shape of the flange portion in plan view.

15. The light emitting device according to claim 8, wherein the convex portion is provided so that it is a circle-like inscribed in the outer shape of the flange portion in plan view.

16. The light emitting device according to claim 9, wherein the convex portion is provided so that it is a circle-like inscribed in the outer shape of the flange portion in plan view.

17. The light emitting device according to claim 8, wherein the flange portion of the sealing member is such that a height of an upper face thereof from a bottom face of the light emitting device substantially coincides with a height of an upper face of the flat portion of the metal member.

18. The light emitting device according to claim 1, wherein at least a part of the flange portion of the sealing member is disposed outwardly of an outer surface of the flat portion of the metal member extending toward the bottom face side of the light emitting device.

* * * * *